(12) United States Patent
Takeuchi et al.

(10) Patent No.: US 7,723,838 B2
(45) Date of Patent: May 25, 2010

(54) PACKAGE STRUCTURE HAVING SEMICONDUCTOR DEVICE EMBEDDED WITHIN WIRING BOARD

(75) Inventors: Yukiharu Takeuchi, Nagano (JP); Hidenori Takayanagi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 92 days.

(21) Appl. No.: 11/037,449

(22) Filed: Jan. 19, 2005

(65) Prior Publication Data

US 2005/0161833 A1 Jul. 28, 2005

(30) Foreign Application Priority Data

Jan. 20, 2004 (JP) ............................... 2004-11666

(51) Int. Cl.
  *H01L 23/12* (2006.01)
  *H01L 23/053* (2006.01)
(52) U.S. Cl. ...................... 257/700; 257/701; 257/702; 438/123
(58) Field of Classification Search ......... 257/685–686, 257/700–702, 758–759, 760, 785, E23.031, 257/E23.059, E23.169, E23.178; 438/123
See application file for complete search history.

(56) References Cited

U.S. PATENT DOCUMENTS

| | | | | |
|---|---|---|---|---|
| 6,400,573 B1 * | 6/2002 | Mowatt et al. | ............... | 361/719 |
| 6,590,291 B2 | 7/2003 | Akagawa | .................... | 257/774 |
| 6,614,104 B2 * | 9/2003 | Farnworth et al. | .......... | 257/686 |
| 6,921,977 B2 * | 7/2005 | Shimizu et al. | ............. | 257/758 |
| 6,939,738 B2 * | 9/2005 | Nakatani et al. | ............ | 438/108 |
| 7,045,899 B2 * | 5/2006 | Yamane et al. | ............... | 257/777 |
| 7,084,513 B2 * | 8/2006 | Matsuki et al. | .............. | 257/777 |
| 7,105,919 B2 * | 9/2006 | Kim | ........................... | 257/700 |
| 7,141,874 B2 * | 11/2006 | Nakatani | .................... | 257/700 |
| 7,190,064 B2 | 3/2007 | Wakabayashi et al. | | |
| 2001/0010627 A1 * | 8/2001 | Akagawa | .................... | 361/761 |
| 2005/0098891 A1 | 5/2005 | Wakabayashi et al. | ...... | 257/758 |
| 2006/0202353 A1 | 9/2006 | Wakabayashi et al. | | |
| 2007/0042594 A1 | 2/2007 | Wakabayashi et al. | | |

FOREIGN PATENT DOCUMENTS

JP 2001-217337 8/2001
JP 2003-318323 11/2003

OTHER PUBLICATIONS

Cover page of Japanese Office Action dated Feb. 12, 2008.

* cited by examiner

*Primary Examiner*—Theresa T Doan
(74) *Attorney, Agent, or Firm*—Kratz, Quintos & Hanson, LLP

(57) ABSTRACT

In a semiconductor device, via holes are formed around a chip buried in a package, one end of a conductor filled in the via hole is covered with a pad portion exposed to the outside, and a wiring layer connected to the other end of the conductor is formed. The portion (pad portion) of the wiring layer which correspond to the conductor is exposed from a protective film, or an external connection terminal is bonded to the top of the pad portion. Electrode terminals of the chip are connected to the wiring layer, and the opposite surface of the chip is exposed to the outside.

7 Claims, 9 Drawing Sheets

PACKAGE STRUCTURE HAVING SEMICONDUCTOR DEVICE EMBEDDED WITHIN WIRING BOARD

CROSS-REFERENCE TO RELATED APPLICATIONS

This application is based on and claims priority of Japanese Patent Application No. 2004-011666 filed on Jan. 20, 2004, the entire contents of which are incorporated herein by reference.

BACKGROUND OF THE INVENTION (a) Field of the Invention

The present invention relates to a semiconductor device and a method of manufacturing the same. More specifically, the present invention relates to a semiconductor device having a package structure in which a semiconductor element (chip) is mounted within a wiring board for a reduction in thickness, and relates to a method of manufacturing the same.

(b) Description of the Related Art

Heretofore, semiconductor devices having various forms have been proposed in which a chip is mounted within a wiring board. As an example, there is a package structure (semiconductor device) intended to form a required circuit block by incorporating and stacking a plurality of chips, for example, typified by System Block Module manufactured by Toshiba Corporation Semiconductor Company. In this semiconductor device, connection between upper and lower layers is established around chips. Accordingly, on the upper and lower surfaces of each package, top-and-bottom connecting pads are placed around the chip. The top-and-bottom connecting pads are used for connecting packages (chips) stacked on and under the relevant package (chip). Most of the top-and-bottom connecting pads are connected also within the relevant package. In such a semiconductor device, plated through holes have been typically used as means for connecting the top-and-bottom connecting pads within the package.

Technologies relating to the above-described known technology include, for example, as described in Japanese unexamined Patent Publication (JPP) 2001-217337, a technology with which multilayer stacking can be realized by burying and mounting a semiconductor chip in a package, and providing external connection terminals on both surfaces of the package, or exposing, from a solder resist layer, terminal formation portions (pad portions) of a wiring pattern to which external connection terminals are to be connected.

As described above, in a known package structure (semiconductor device) adapted for the stacking of a plurality of chips using top-and-bottom connecting pads provided in a region around the chips, plated through holes have been used when the top-and-bottom connecting pads are connected within the package.

However, plated through holes are often formed by drilling. Consequently, the diameters of the through holes become relatively large (approximately 250 to 300 μm in the state of the art), and there has been a disadvantage in that a larger area is accordingly required. Further, there are constraints on design (i.e., the degree of freedom of wiring is low), such as the technical difficulty of placing top-and-bottom connecting pads on plated through holes. Accordingly, the relevant pads must be formed at other positions, and thus an area required around the chip increases. This has become an obstacle to miniaturization.

Essentially, one of major purposes in stacking chips is to enhance functionality by incorporating a larger number of functional elements (chips) into a smaller volume. However, the above-described problem becomes a serious obstacle to the accomplishment of this purpose. Namely, in a package (semiconductor device) containing a chip, a region around the chip is not a portion which exerts an essential function as the semiconductor device, but a portion used for simply connecting upper and lower stacked packages. Accordingly, in consideration of recent demands for smaller sizes, higher densities, and the like, of thin-type packages, it is more desirable that an area required around the chip is as small as possible.

SUMMARY OF THE INVENTION

An object of the present invention is to provide a semiconductor device and a method of manufacturing the semiconductor device in which when a semiconductor element (chip) is mounted within a package, miniaturization is realized and the degree of freedom of wiring is increased, in which a three-dimensional arrangement configuration of chips and connections therebetween can be easily realized as needed, and consequently which contributes to an enhancement of functionality.

To attain the above object, according to one aspect of the present invention, there is provided a semiconductor device including: a wiring board; and at least one semiconductor element buried in the wiring board, wherein the wiring board has an insulating base material; one end of a conductor filled in a via hole which is formed in a region around the semiconductor element to pierce the insulating base material in a thickness direction is covered with a first pad portion which is made of conductive material and which is exposed to one surface of the insulating base material; a wiring layer which has a required pattern shape and which is connected to another end of the conductor is formed on another surface of the insulating base material; and a protective film covering the wiring layer and the insulating base material is formed with a second pad portion exposed, the second pad portion being delimited in a portion of the wiring layer which corresponds to the conductor, and wherein at least part of electrode terminals of the semiconductor element is electrically connected to the second pad portion of the wiring layer; and a surface thereof opposite to a surface having the electrode terminals formed thereon is exposed to one surface of the insulating base material.

In the semiconductor device according to this aspect, the semiconductor element (chip) is buried and mounted within the wiring board used as a package, and the via hole piercing the wiring board vertically (in the thickness direction) is formed in a region around the chip. The via hole can be formed to have a small diameter, for example, by laser processing, compared with a through hole formed by drilling as heretofore. This means that an area required around the chip can be relatively reduced, and contributes to a miniaturization of the package (semiconductor device).

Moreover, since the via hole is filled with the conductor, the first pad portion (top-and-bottom connecting pad) can be placed thereon (on one end of the conductor). Namely, compared with the case where a plated through hole is formed as heretofore and where a top-and-bottom connecting pad cannot be placed thereon and must be formed at another position, the degree of freedom of wiring can be increased. Further, since the relevant pad does not need to be formed at another position, an area required around the chip can be accordingly reduced. This contributes to a further miniaturization of the package (semiconductor device).

Furthermore, devices according to the present aspect can be stacked in a multilayered manner by using the first and second pad portions respectively exposed from both surfaces of the package (semiconductor device) as top-and-bottom connecting pads, and as needed, by interposing external connection terminals therebetween. Accordingly, it is possible to easily realize a three-dimensional arrangement configuration of chips and connections therebetween. This contributes to an enhancement of functionality.

Also, according to another aspect of the present invention, there is provided a method of manufacturing a semiconductor device, including the steps of: forming a first pad portion made of conductive material at a specific position around a semiconductor element mount region on one surface of a conductive base material; mounting a semiconductor element on the semiconductor element mount region; forming an insulating base material on the conductive base material to bury the semiconductor element therein; forming a first via hole in the insulating base material so as to reach the first pad portion; filling the first via hole with a conductor; forming a second via hole at a specific position in the insulating base material so as to reach an electrode terminal of the semiconductor element; forming a wiring layer having a required pattern shape on the insulating base material so as to fill the second via hole and to be connected to the conductor filled in the first via hole; forming a protective film which covers the wiring layer and the insulating base material in such a way that a second pad portion is exposed, the second pad portion being delimited in a portion of the wiring layer which corresponds to the conductor; and removing the conductive base material.

Also, according to still another aspect of the present invention, there is provided a method of manufacturing a semiconductor device, including the steps of: forming a recessed portion in a portion of one surface of a conductive base material which corresponds to a specific position around a semiconductor element mount region, and then forming a first pad portion made of conductive material on a surface of the recessed portion; mounting a semiconductor element on the semiconductor element mount region; forming an insulating base material on the conductive base material to bury the semiconductor element therein; forming a first via hole in the insulating base material so as to reach the first pad portion; filling the first via hole with a conductor; forming a second via hole at a specific position in the insulating base material so as to reach an electrode terminal of the semiconductor element; forming a wiring layer having a required pattern shape on the insulating base material so as to fill the second via hole and to be connected to the conductor filled in the first via hole; forming a protective film which covers the wiring layer and the insulating base material in such a way that a second pad portion is exposed, the second pad portion being delimited in a portion of the wiring layer which corresponds to the conductor; and removing the conductive base material.

DESCRIPTION OF THE PREFERRED EMBODIMENTS

Figure 1:
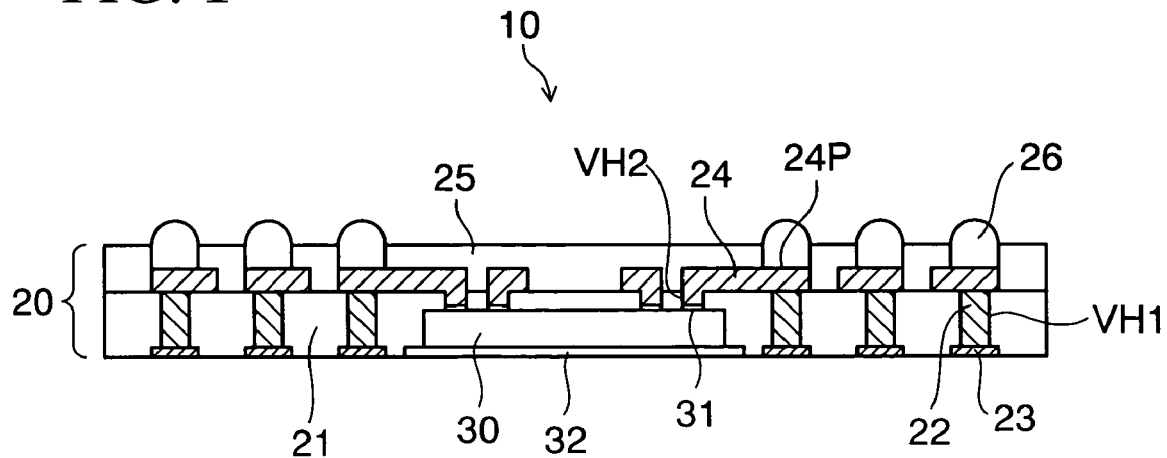
FIG. 1 is a cross-sectional view showing the structure of a semiconductor device according to a first embodiment of the present invention.

FIG. 1 schematically shows a cross-sectional structure of a semiconductor device according to a first embodiment of the present invention.

The semiconductor device 10 according to this embodiment includes a wiring board 20 used as a package, and a semiconductor element (silicon (Si) chip) 30 buried in the package (wiring board) 20. In the example shown in the drawing, one semiconductor chip 30 is buried in one package. However, two or more semiconductor chips 30 may be appropriately buried therein depending on functions required for the present device 10.

In the package (wiring board) 20, reference numeral 21 denotes an insulating base material (e.g., a resin layer made of epoxy resin) which serves as a base for the wiring board. In this resin layer 21, via holes VH1 piercing the resin layer 21 in the thickness direction are formed in a region around the semiconductor chip 30. These via holes VH1 are filled with conductors 22 (e.g., metal such as copper (Cu)). At one end (lower surface in the example shown in the drawing) of the individual conductor 22, a pad portion 23 which has a slightly larger diameter than that of the via hole VH1 and which is made of conductive material (e.g., palladium (Pd), gold (Au)) is formed. The pad portion 23 is exposed to one surface (lower surface) of the resin layer 21. Further, on the other surface (upper surface) of the resin layer 21, a Cu wiring layer 24 which is connected to the other end of the conductor 22 and which has a predetermined pattern shape is formed. The portion of the wiring layer 24 which corresponds to the conductor 22 is delimited as a pad portion 24P. Furthermore, a protective film 25 (e.g., solder resist layer) is formed in such a manner that the entire surfaces of the wiring layer 24 and the resin layer 21 are covered, except for the regions of the pad portions 24P, and external connection terminals 26 (e.g., solder bumps) are bonded to the respective tops of the pad portions 24P.

The external connection terminals 26 are provided in the example shown in the drawing, but do not necessarily need to be provided. It is essential only that part of the wiring layer 24 (the pad portions 24P) is exposed from the solder resist layer 25 so that external connection terminals can be bonded thereto when necessary. Further, the external connection terminals 26 are provided only on one surface (upper surface) of the package (wiring board) 20 in the example shown in the drawing, but may be provided on both surfaces of the package (wiring board) 20 as needed. In this case, the external connection terminals 26 are also bonded to the pad portions 23 on the lower side.

On the other hand, as for the semiconductor chip 30, at least some of the electrode terminals 31 thereof are electrically connected to the pad portions 24P via the wiring layer 24 filled in the via holes VH2. The back surface (surface opposite to the surface on which the electrode terminals 31 are formed) of the semiconductor chip 30 is covered with an insulating layer 32 exposed to one surface (lower surface) of the resin layer 21. Further, it is desirable that a semiconductor chip having a thickness as small as possible is used as the semiconductor chip 30 because the semiconductor chip 30 is mounted within the package (wiring board) 20. In the state of the art, semiconductor chips having thicknesses of approximately 50 μm to 100 μm have been developed. It is sufficiently possible to bury a semiconductor chip having such a thickness within the board. Accordingly, in the present embodiment, a thin semiconductor chip having a thickness of approximately 50 μm is used as the semiconductor chip 30.

The semiconductor device 10 according to the present embodiment has the following features: the thin semiconductor chip 30 is buried within the package (wiring board) 20; the via holes VH1 formed around the semiconductor chip 30 are filled with the conductors 22; and top-and-bottom connecting pads (pad portions 23 and 24P) are formed or delimited on the conductors 22, thus making it possible to realize multilayer stacking using the top-and-bottom connecting pads as needed, as described later.

Hereinafter, a method of manufacturing the semiconductor device 10 according to the first embodiment will be described with reference to FIGS. 2A to 3E which show manufacturing steps thereof in order.

To begin with, in the first step (FIG. 2A), copper foil 27 is prepared as a conductive base material.

In the next step (FIG. 2B), the pad portions 23 which have diameters of approximately 150 μm and which are made of conductive material are formed at specific positions (positions corresponding to portions in which via holes to be described later are to be formed) around a semiconductor element mount region MR on one surface (upper surface in the example shown in the drawing) of the copper foil 27. For example, the specific positions on the copper foil 27 (Cu) are plated with gold (Au), then plated with palladium (Pd), and then plated with nickel (Ni), furthermore, the tops thereof are plated with gold (Au) as needed, thus forming the pad portions 23.

When the pad portions 23 are formed, a die pad portion having the same plating constitution as the pad portions 23 may be formed in the semiconductor element mount region MR as indicated by a dashed line in the drawing.

In the next step (FIG. 2C), the thin semiconductor chip 30 having a thickness of approximately 50 μm is mounted on the semiconductor element mount region MR on the copper foil 27 with the insulating layer 32 interposed therebetween. For example, non-conductive paste (NCP) is applied to the semiconductor element mount region MR, or a non-conductive film (NCF) is attached to the semiconductor element mount region MR, and the semiconductor chip 30 is bonded thereto with the NCP or the NCF in the state where the surface of the semiconductor chip 30 which is opposite to the surface having the electrode terminals 31 formed thereon is faced down. Alternatively, insulating resin, such as underfill resin to be filled into a space between a chip and a mount board in flip-chip mounting, may be used.

In the next step (FIG. 2D), the resin layer 21 is formed on the copper foil 27 in such a manner that the semiconductor chip 30 is buried. For example, the resin layer 21 is formed using thermosetting resin, such as epoxy to be used as interlayer insulating material when a build-up printed circuit board is manufactured. Alternatively, instead of epoxy resin, polyimide resin may be used. This resin layer 21 functions as an insulating base material for the package (wiring board) 20.

In the next step (FIG. 2E), the via holes VH1 reaching the pad portions 23 are formed at specific positions (positions corresponding to the portions in which the pad portions 23 are formed) of the resin layer 21. For example, the via holes VH1 having small diameters (of approximately 100 μm) can be easily formed by removing the corresponding portions of the resin layer 21 using a $CO_2$ laser, an excimer laser, or the like.

In the next step (FIG. 2F), the via holes VH1 are filled with the conductors 22. For example, conductive paste containing metal, such as copper (Cu), is filled into the via holes VH1, or electrolytic Cu plating is performed using the copper foil 27 as a power supplying layer, thus filling the via holes VH1.

Figure 2A:
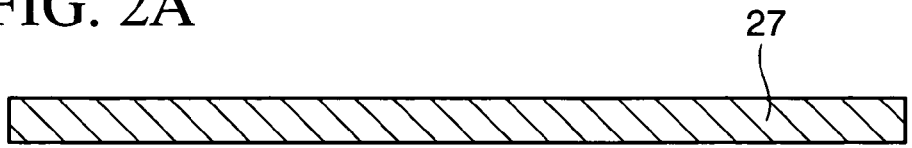
FIGS. 2A to 2F are cross-sectional views showing manufacturing steps for the semiconductor device of FIG. 1.
Figure 2B:
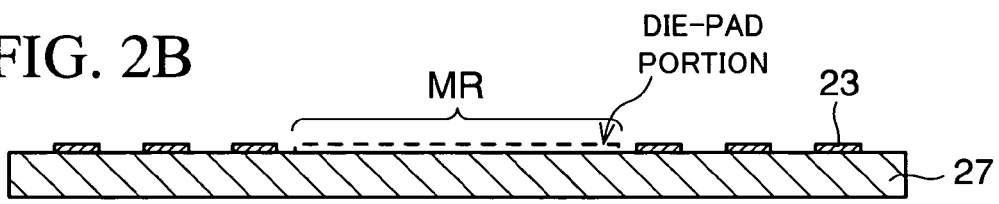
Figure 2C:
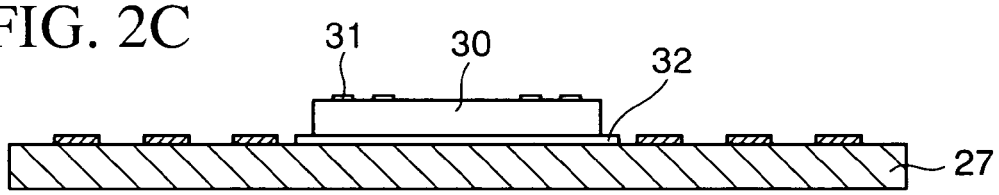
Figure 2D:
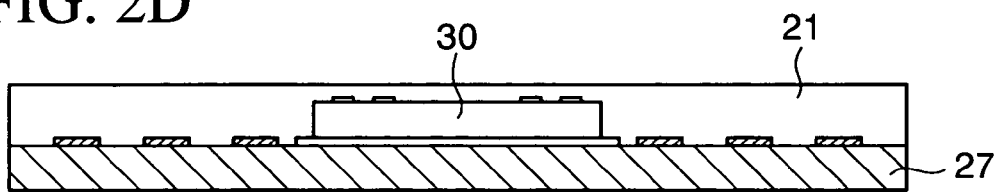
Figure 2E:
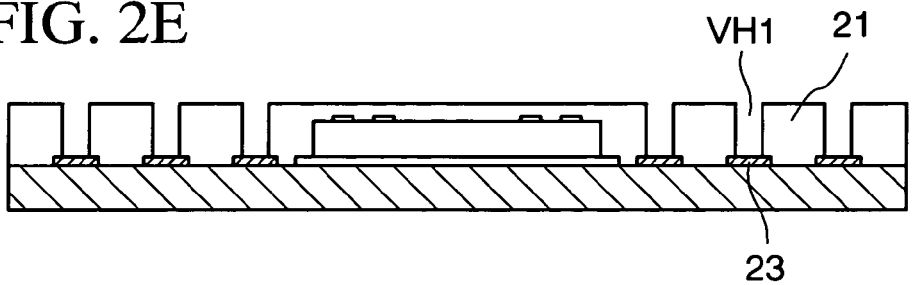
Figure 2F:
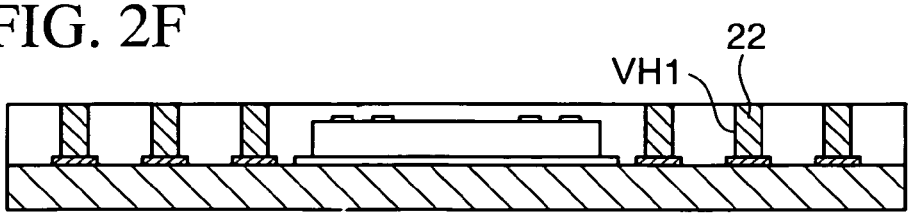
Figure 3A:
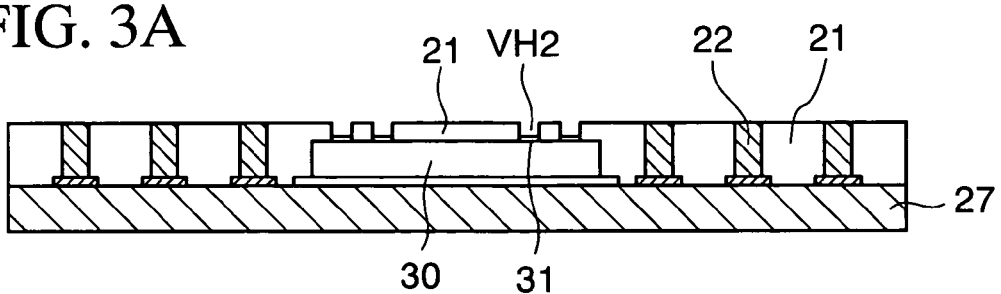
FIGS. 3A to 3E are cross-sectional views showing manufacturing steps subsequent to the manufacturing steps of FIGS. 2A to 2F.
Figure 3B:
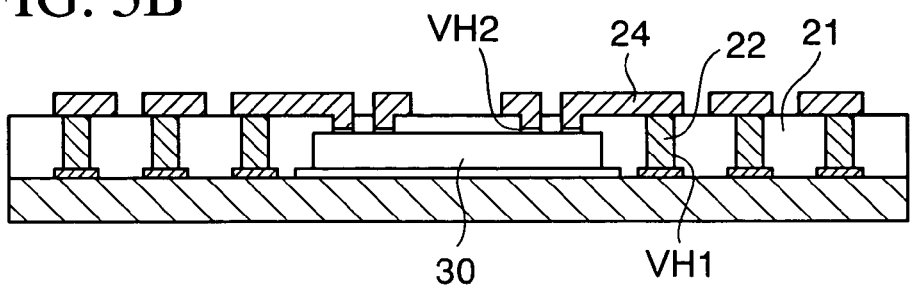
Figure 3C:
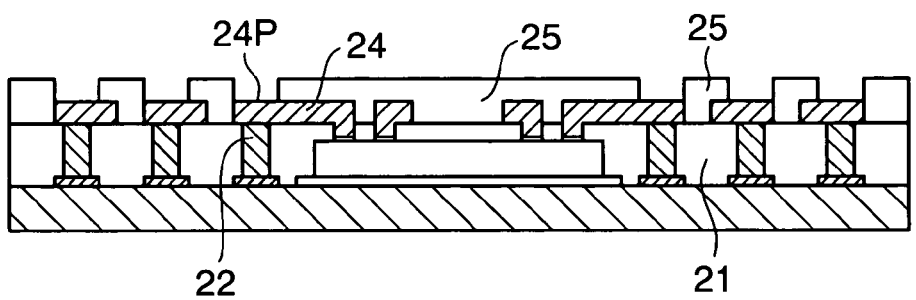
Figure 3D:
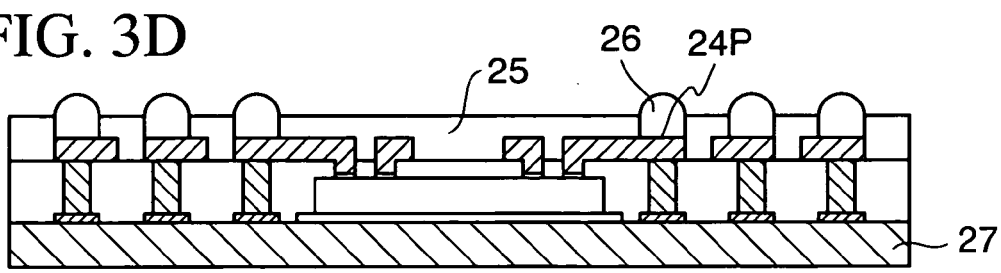
Figure 3E:
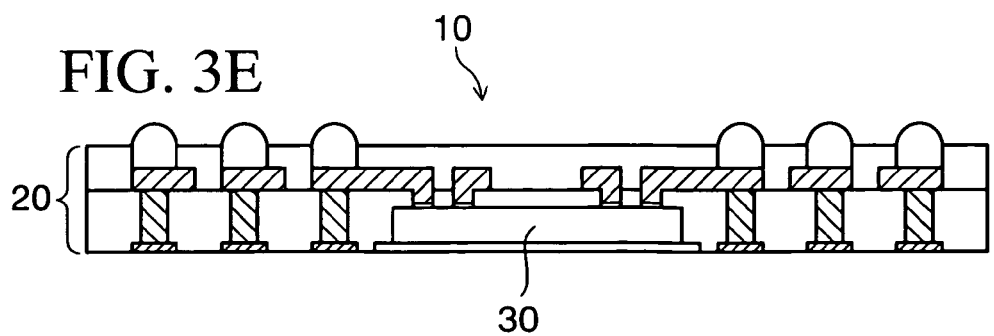

In the next step (FIG. 3A), similar to the process performed in the step of FIG. 2E, the via holes VH2 reaching the electrode terminals 31 of the semiconductor chip 30 are formed at specific positions (positions corresponding to the electrode terminals 31 of the buried semiconductor chip 30) of the resin layer 21 by laser processing.

In the next step (FIG. 3B), the wiring layer 24 having a required pattern shape is formed on the resin layer 21 so as to fill the via holes VH2 on the semiconductor chip 30 and to be connected to the conductors 22 filled in the via holes VH1 around the semiconductor chip. Specifically, a thin metal film is formed on the entire surface of the resin layer 21 including the insides of the via holes VH2 by sputtering, electroless plating, or the like, and a pattern (wiring layer 24) is formed by a subtractive method, a semi-additive method, or the like, using the thin metal film as a seed. For example, the entire surface of the resin layer 21 including the insides of the via holes VH2 is made into a catalyst, electroless Cu plating is performed to a thickness of approximately 3 μm (formation of the thin metal film), then a plating pattern is formed of a plating resist. The surface of the thin metal film is electrolytically plated with Cu by pattern plating using the thin metal film as a power supplying layer, then the plating resist is removed, and thereafter unnecessary Cu is etched using the pattern made by electrolytic Cu plating as a mask, thus forming a Cu pattern (wiring layer 24).

Furthermore, the top of the wiring layer 24 (Cu) is plated with Ni/Au as needed. This is intended to improve the adhesiveness to the wiring layer when solder bonding is performed in a later step.

In the next step (FIG. 3C), the solder resist layer 25 is formed to cover the wiring layer 24 and the resin layer 21 in such a manner that the portions (pad portions 24P) of the wiring layer 24 which correspond to the conductors 22 are exposed. For example, photosensitive solder resist is applied to the entire surfaces of the wiring layer 24 and the resin layer 21. Exposure and development are performed in accordance with the shapes of the required pad portions 24P (patterning of solder resist), and openings are formed in the portions of the solder resist layer which correspond to the regions of the pad portions 24P. Thus, the pad portions 24P of the wiring layer 24 are exposed, and the other portion of the wiring layer 24 is covered with the solder resist layer 25. The solder resist layer 25 functions as a protective film for the package (wiring board) 20.

In the next step (FIG. 3D), the solder bumps 26 as external connection terminals are formed on the pad portions 24P (Cu) exposed from the solder resist layer (protective film) 25. The solder bumps 26 can be formed, for example, by plating. Alternatively, the following method may be adopted: after flux is applied to the pad portions 24P, solder balls are mounted thereon, or solder paste is supplied thereto by printing, and the solder balls or the solder paste is made into bumps by reflow at a temperature of approximately 240° C. to 260° C. In this case, for aftertreatment, the surface is cleaned to remove the flux.

In the last step (FIG. 3E), the copper foil 27 used as the conductive base material is removed by wet etching. Thus, the semiconductor device 10 according to the first embodiment is manufactured.

As described above, according to the first embodiment (FIGS. 1 to 3E), the semiconductor chip 30 is buried within the wiring board 20 used as a package, and the via holes VH1 are formed at specific positions around the semiconductor chip 30 by laser processing. Accordingly, the diameters of the via holes VH1 can be made small compared with those of through holes formed by drilling as heretofore. Incidentally, in the state of the art, the diameters of through holes are approximately 250 to 300 μm, whereas, in the present embodiment, the diameters of the via holes VH1 can be made as small as approximately 100 μm. Thus, an area required around the semiconductor chip 30 becomes relatively small. Accordingly, the package 20 (semiconductor device 10) can be miniaturized.

Further, since the via holes VH1 are filled with the conductors 22, the pad portions 23 (top-and-bottom connecting pads) can be placed on the conductors 22. In other words, the degree of freedom of wiring can be increased compared with the following case: plated through holes are formed as heretofore, and therefore top-and-bottom connecting pads cannot be placed thereon and must be formed at other positions. In addition, since the relevant pads do not need to be formed at other positions, an area required around the semiconductor chip 30 can be accordingly reduced. This contributes to a further miniaturization of the package 20 (semiconductor device 10).

Moreover, the packages according to the present embodiment can be stacked in a multilayered manner as needed, as described later, by using the pad portions 23 and 24P respectively exposed from both surfaces of the package 20 (semiconductor device 10) as top-and-bottom connecting pads or by interposing the external connection terminals (solder bumps 26) bonded to the tops of the pad portions 24P. Accordingly, a three-dimensional arrangement configuration of the semiconductor chips 30 and connections therebetween can be easily realized. This contributes to an enhancement of functionality of a semiconductor device.

Furthermore, although the external connection terminals (solder bumps 26) do not necessarily need to be provided as described above, the provision of the external connection terminals has the following advantage. Specifically, since the formation of the external connection terminals (solder bumps 26) in the step of FIG. 3D makes it possible to conduct tests of functions, operations, and the like, of the package 20 (semiconductor device 10) in which the semiconductor chip 30 is buried, the relevant package can be rejected as a defective package at this stage if the relevant package does not pass the tests. Namely, only non-defective packages (semiconductor devices) can be picked up. This makes it possible to increase yield on a product (semiconductor device) basis when non-defective packages are stacked in a multilayer structure to be modularized as described later.

Figure 4:
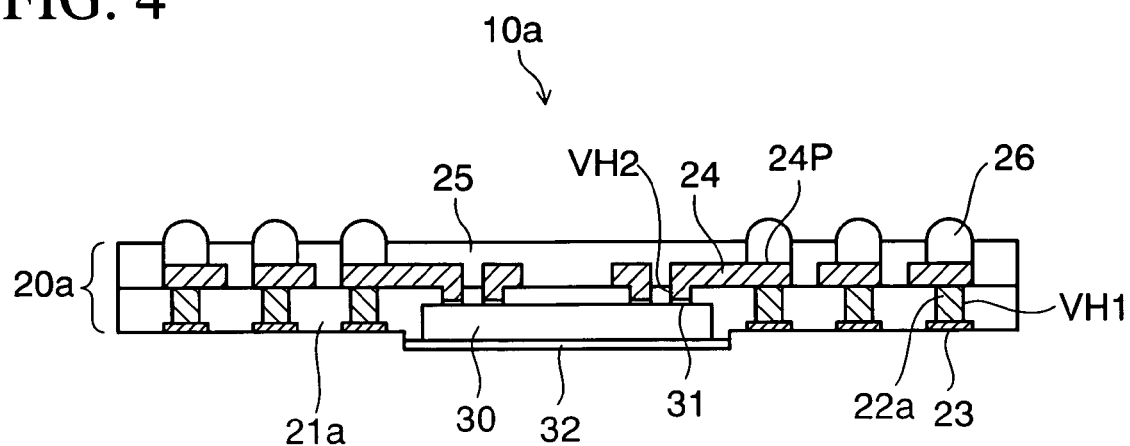
FIG. 4 is a cross-sectional view showing the structure of a semiconductor device according to a second embodiment of the present invention.

FIG. 4 schematically shows a cross-sectional structure of a semiconductor device according to a second embodiment of the present invention.

In this embodiment, similar to the first embodiment (FIG. 1), the semiconductor device 10a includes a wiring board 20a used as a package, and the semiconductor chip 30 buried in the package (wiring board) 20a. The package (wiring board) 20a in this embodiment differs from the package (wiring board) 20 in the first embodiment in that a resin layer 21a is formed in such a manner that the exposed surface of the insulating layer 32 protrudes from one surface (surface in which the pad portions 23 are formed) of the resin layer 21a. Other components and functions thereof are the same as those of the first embodiment, and thus the explanation thereof is omitted.

Figure 5A:
FIGS. 5A to 5F are cross-sectional views showing manufacturing steps for the semiconductor device of FIG. 4.
Figure 5B:
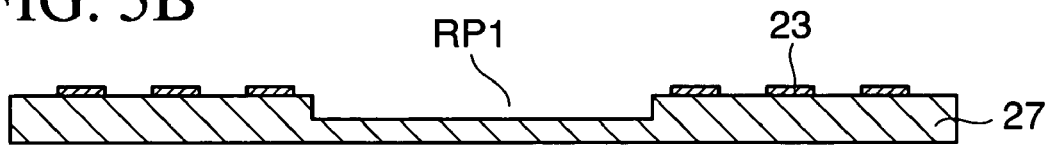
Figure 5C:
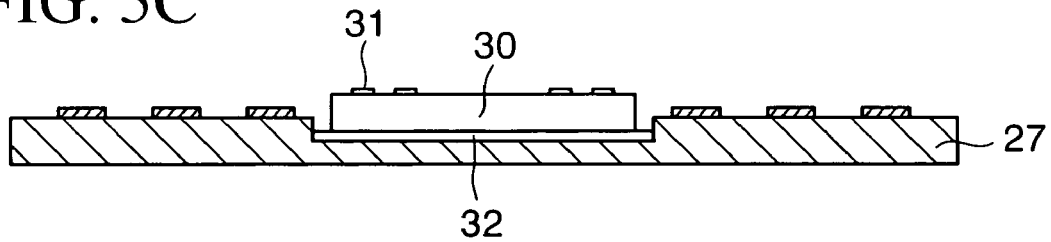
Figure 5D:
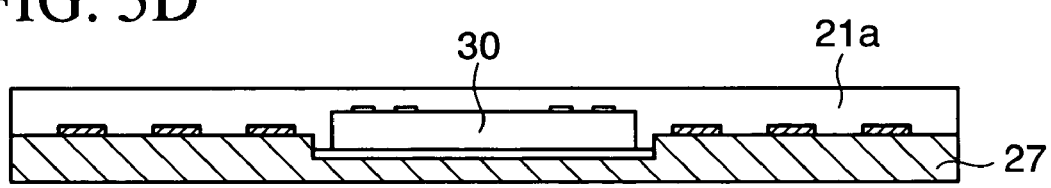
Figure 5E:
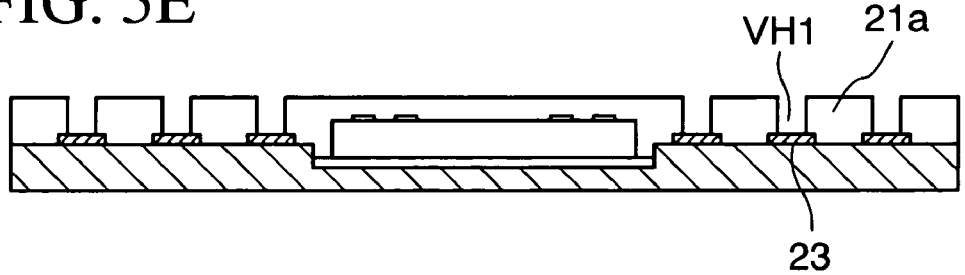
Figure 5F:
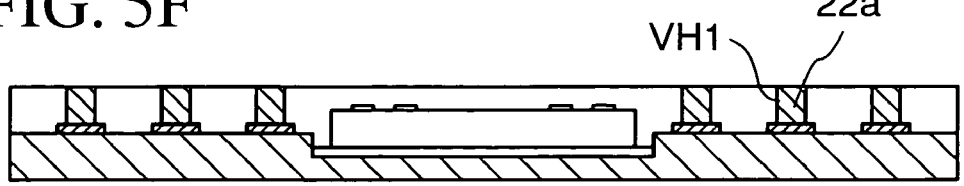
Figure 6A:
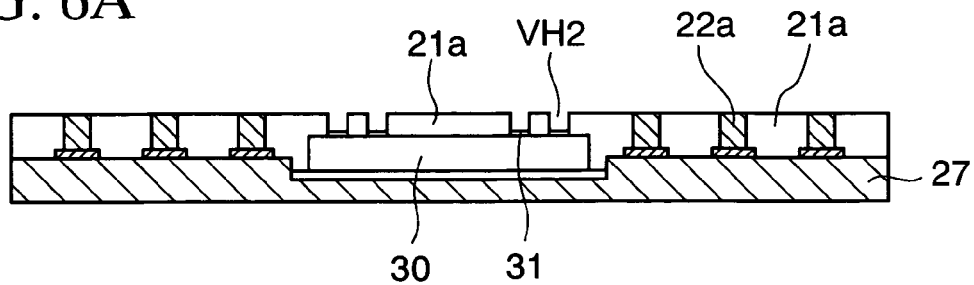
FIGS. 6A to 6E are cross-sectional views showing manufacturing steps subsequent to the manufacturing steps of FIGS. 5A to 5F.
Figure 6B:
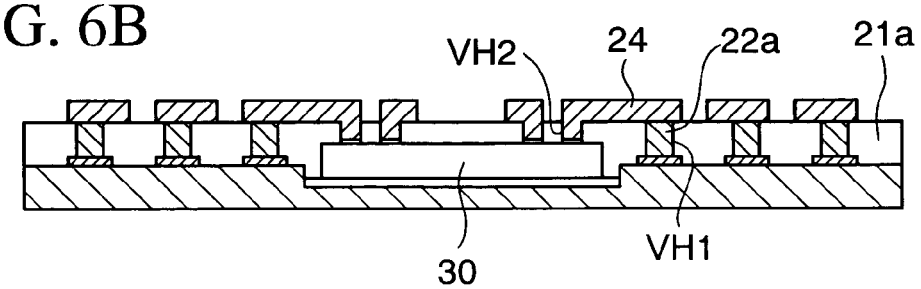
Figure 6C:
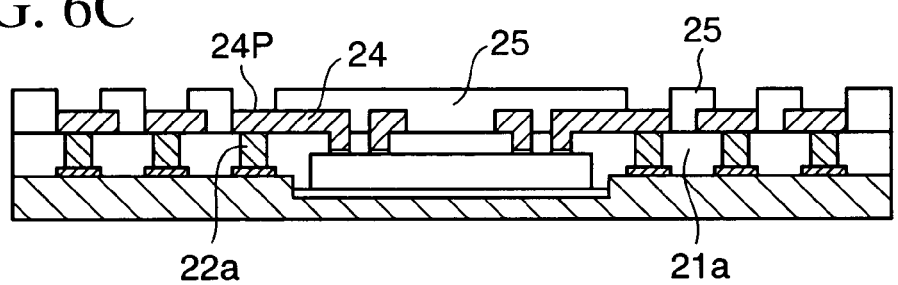
Figure 6D:
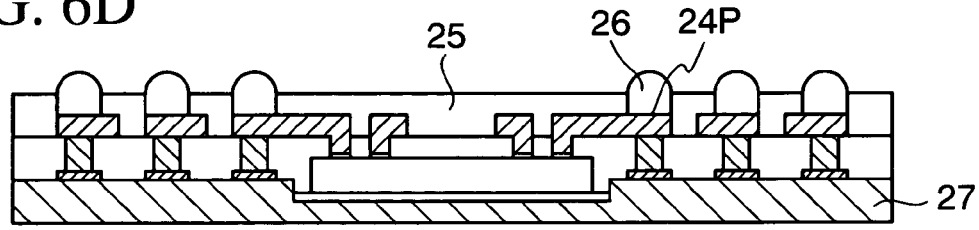
Figure 6E:
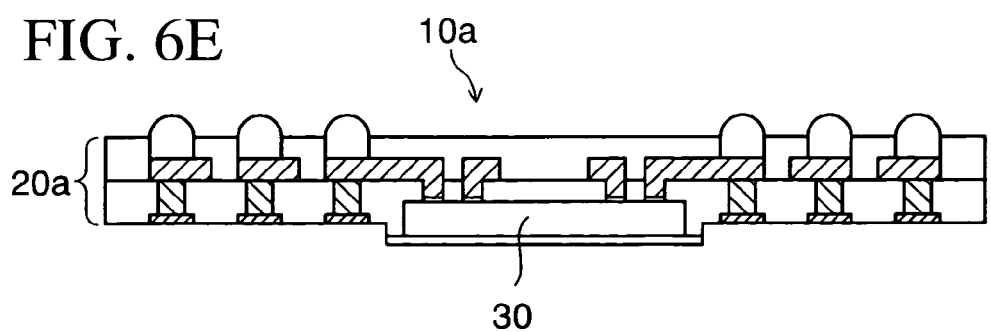

Further, in a method of manufacturing the semiconductor device 10a of this embodiment, part of manufacturing steps thereof are also different because of the features of the above-described constitution. Namely, the manufacturing method (FIGS. 5A to 6E) according to this embodiment differs from the manufacturing method (FIGS. 2A to 3E) according to the first embodiment in that when the pad portions 23 are formed at specific positions around the semiconductor element mount region on one surface of the copper foil 27 in the step of FIG. 5B, a recessed portion RP1 is further formed in the portion corresponding to the semiconductor element mount region by half-etching. Since the recessed portion RP1 is formed in the portion corresponding to the semiconductor element mount region, the surface in which the insulating layer 32 is formed protrudes from the surface in which the pad portions 23 are formed when the resin layer 21a is formed in a later step (FIG. 5D). Namely, if the thickness of the resin layer 21a on the semiconductor chip 30 is equal to that (thickness of the resin layer 21) in the case of the first embodiment, the thickness of the resin layer 21a on the pad portions 23 becomes relatively small. Accordingly, when the via holes VH1 are formed in a later step (FIG. 5E), the depths of the via holes VH1 are relatively reduced. Other steps are basically the same as those for the case of the first embodiment, and thus the explanation thereof is omitted.

According to the second embodiment (FIGS. 4 to 6E), in addition to various advantages obtained in the first embodiment, the depths of the via holes VH1 formed around the semiconductor chip 30 can also be reduced (specific advantage to the second embodiment) based on the features of the above-described constitution. Namely, since the laser irradiation time can be reduced, the diameters of the via holes VH1 can be further reduced. This contributes to a further miniaturization of the package 20a (semiconductor device 10a).

Figure 7:
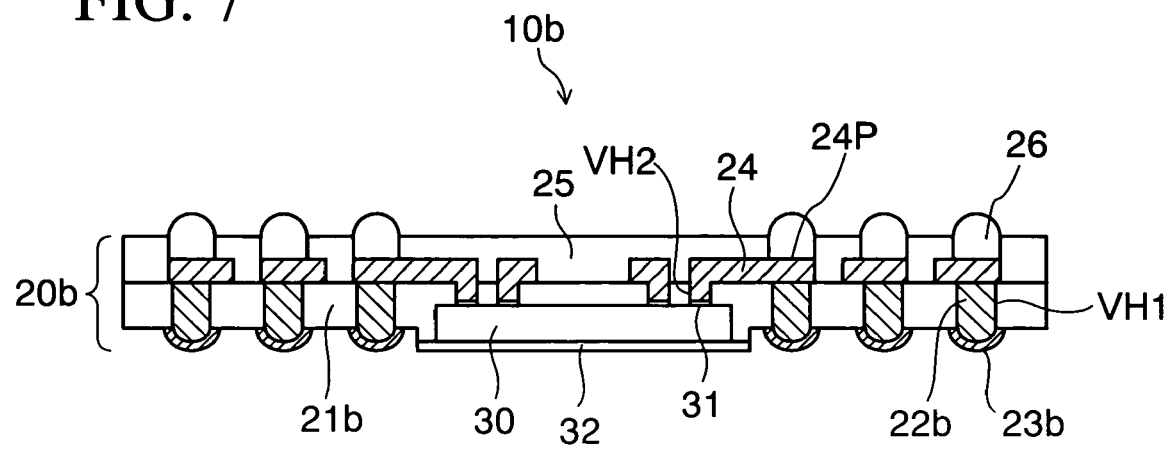
FIG. 7 is a cross-sectional view showing the structure of a semiconductor device according to a third embodiment of the present invention.

FIG. 7 schematically shows a cross-sectional structure of a semiconductor device according to a third embodiment of the present invention.

In this embodiment, similar to the second embodiment (FIG. 4), the semiconductor device 10b includes a wiring board 20b used as a package, and the semiconductor chip 30 buried in the package (wiring board) 20b. The package (wiring board) 20b in this embodiment differs from the package (wiring board) 20a in the second embodiment in that one end of the conductor 22b filled in the via hole VH1 protrudes from one surface (lower surface in the example shown in the drawing) of a resin layer 21b, and that the pad portion 23b is formed to follow the shape of the protruded surface (convex surface) of the conductor 22b. Other components and functions thereof are the same as those of the second embodiment, and thus the explanation thereof is omitted.

Further, in a method of manufacturing the semiconductor device 10b of this embodiment, part of manufacturing steps thereof are also different because of the features of the above-described constitution. Namely, the manufacturing method (FIGS. 8A to 9E) according to this embodiment differs from the manufacturing method (FIGS. 5A to 6E) according to the second embodiment in the following points: in the step of FIG. 8B, a recessed portion RP1 and recessed portions RP2 are formed by half-etching in the portion of one surface of the copper foil 27 which corresponds to the semiconductor element mount region and in the portions thereof which correspond to specific positions around the semiconductor element mount region, respectively; and furthermore, the pad portions 23b are formed on the surfaces of the recessed portions RP2. Since the recessed portions RP2 are formed in the portions where the pad portions 23b are to be formed, one end of the conductor 22b protrudes from one surface (lower surface) of the resin layer 21b when the conductor 22b is filled into the via hole VH1 in a later step (FIG. 8F). Other steps are basically the same as those for the case of the second embodiment, and thus the explanation thereof is omitted.

According to the third embodiment (FIGS. 7 to 9E), in addition to various advantages obtained in the second embodiment (the advantages obtained in the first embodiment and the advantage specific to the second embodiment), the amount of solder used for the connection between packages can also be decreased based on the features of the above-described constitution when packages 20b (semiconductor devices 10b) according to the present embodiment are stacked in a multilayer structure to be modularized, because the pad portions 23b protrude.

Figure 8A:
FIGS. 8A to 8F are cross-sectional views showing manufacturing steps for the semiconductor device of FIG. 7.
Figure 8B:
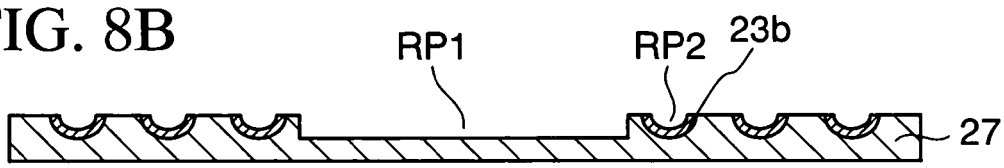
Figure 8C:
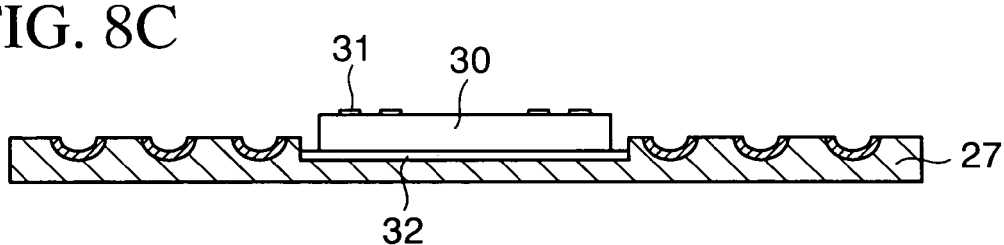
Figure 8D:
Figure 8E:
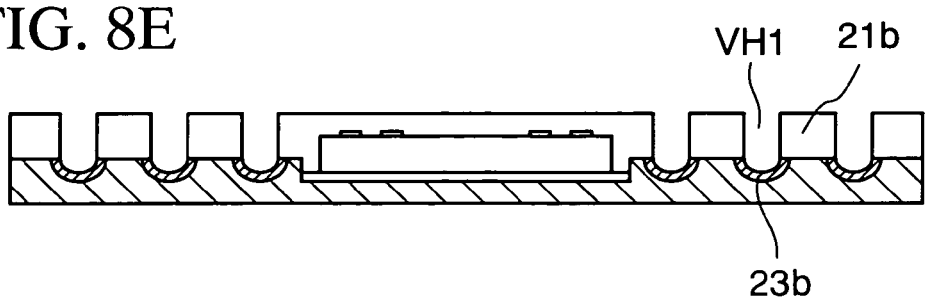
Figure 8F:
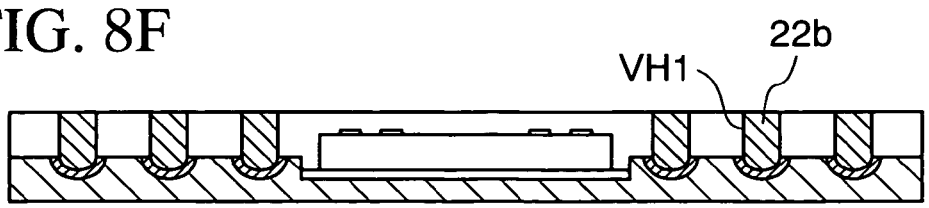
Figure 9A:
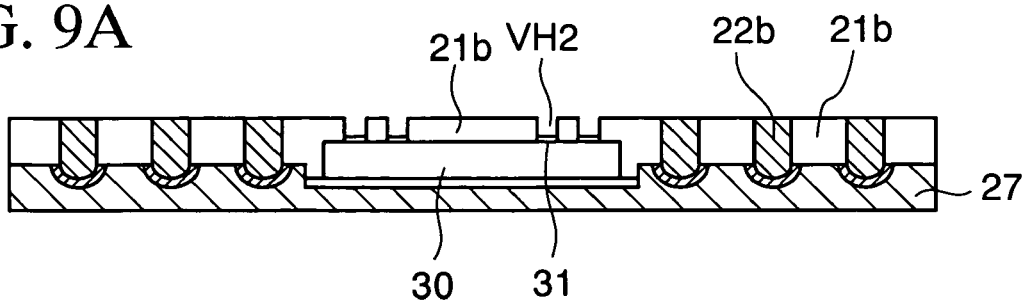
FIGS. 9A to 9E are cross-sectional views showing manufacturing steps subsequent to the manufacturing steps of FIGS. 8A to 8F.
Figure 9B:
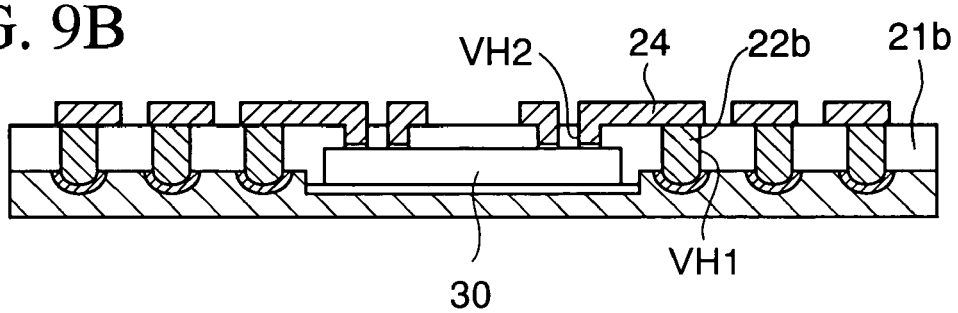
Figure 9C:
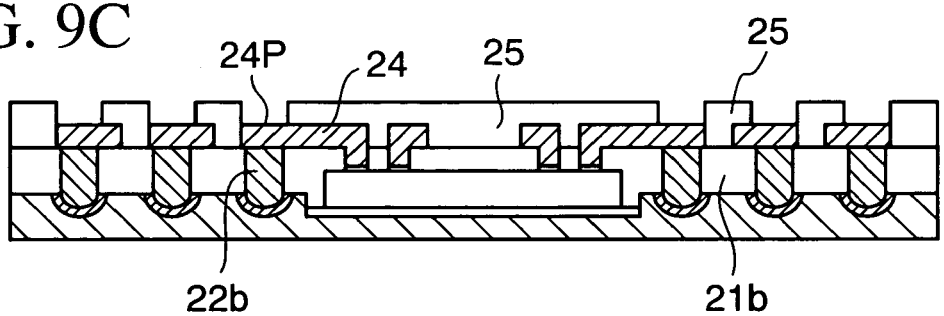
Figure 9D:
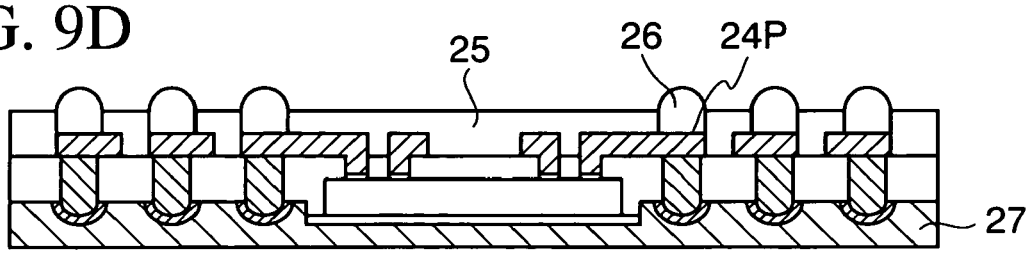
Figure 9E:
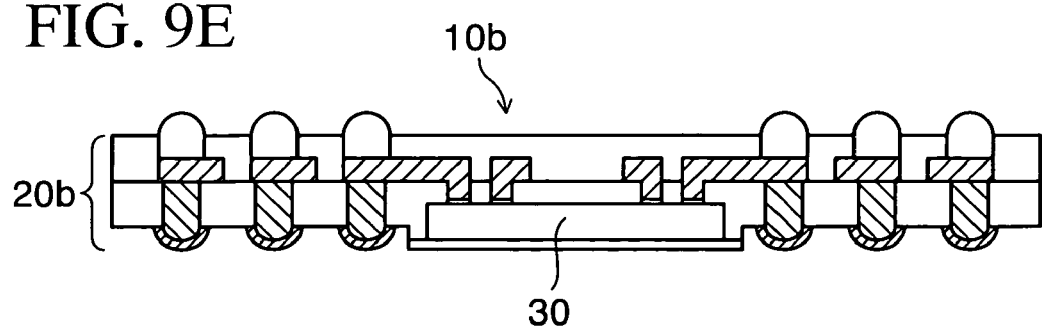

Further, if solder is filled into the recessed portions RP2 by electrolytic solder plating, instead of forming the pad portions 23b on the recessed portions RP2 in the step of FIG. 8B, solder bumps as external connection terminals of the semiconductor device 10b can be finally constituted.

Incidentally, in the constitution (FIG. 7) according to the third embodiment, similar to the constitution (FIG. 4) according to the second embodiment, the exposed surface of the insulating layer 32 protrudes from one surface (surface in which the pad portions 23b are formed) of the resin layer 21b. However, it is a matter of course that the exposed surface of the insulating layer 32 does not necessarily need to be protruded. For example, similar to the constitution (FIG. 1) according to the first embodiment, the exposed surface of the insulating layer 32 may be formed to be positioned in the same plane as one surface of the resin layer 21b.

Figure 10:
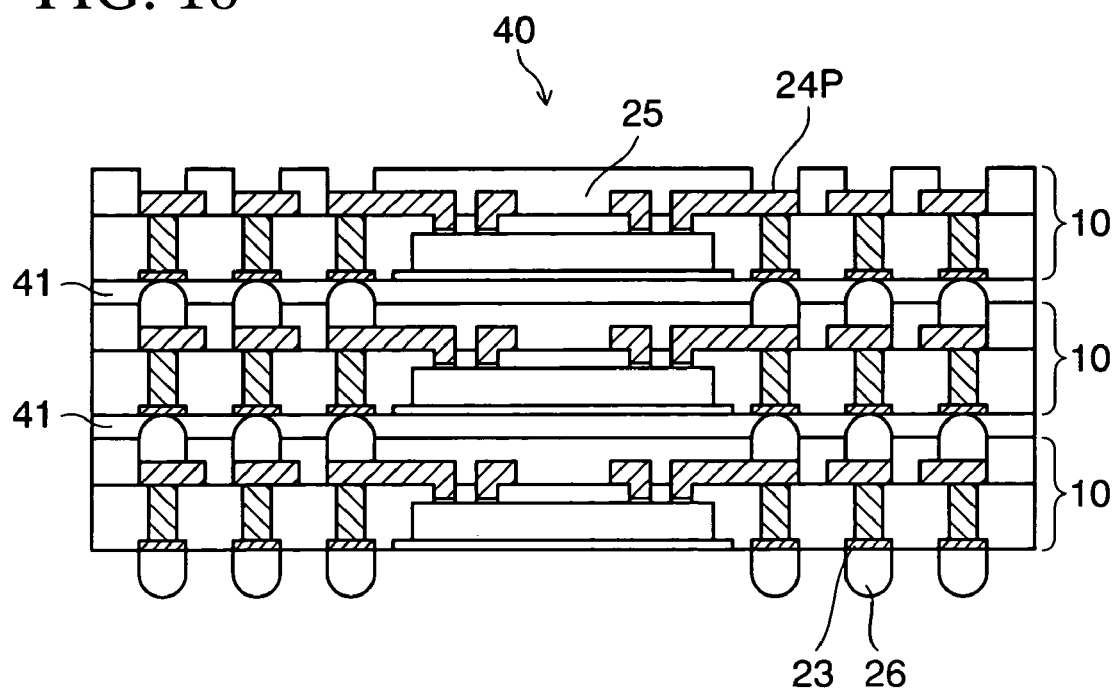
FIG. 10 is a cross-sectional view showing the structure of a semiconductor device according to a fourth embodiment of the present invention.
Figure 11:
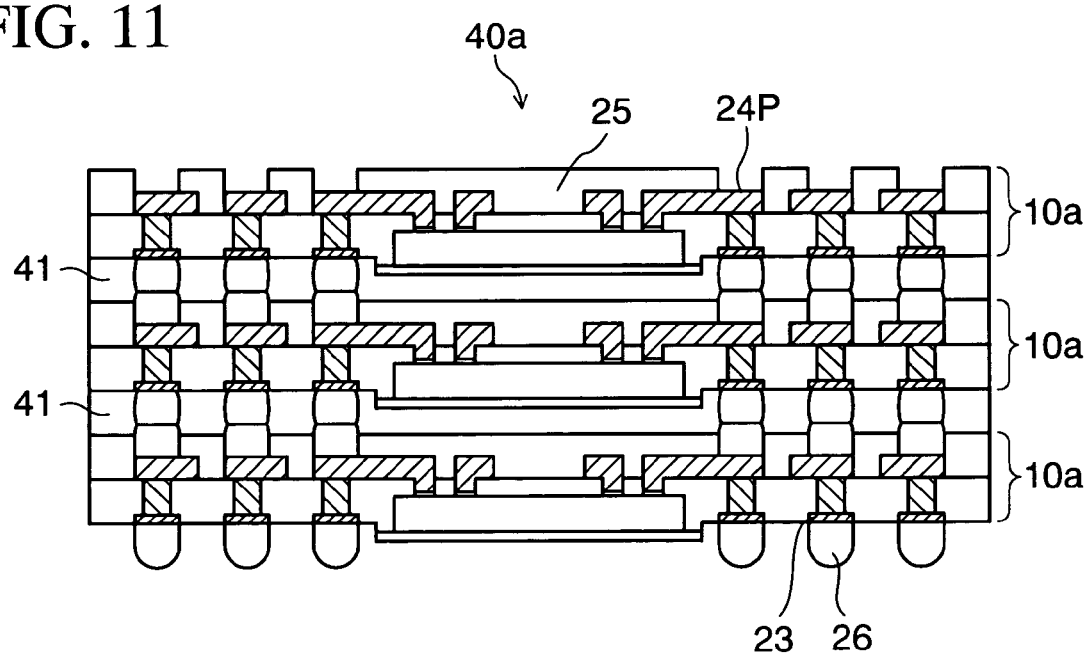
FIG. 11 is a cross-sectional view showing the structure of a semiconductor device according to a fifth embodiment of the present invention.
Figure 12:
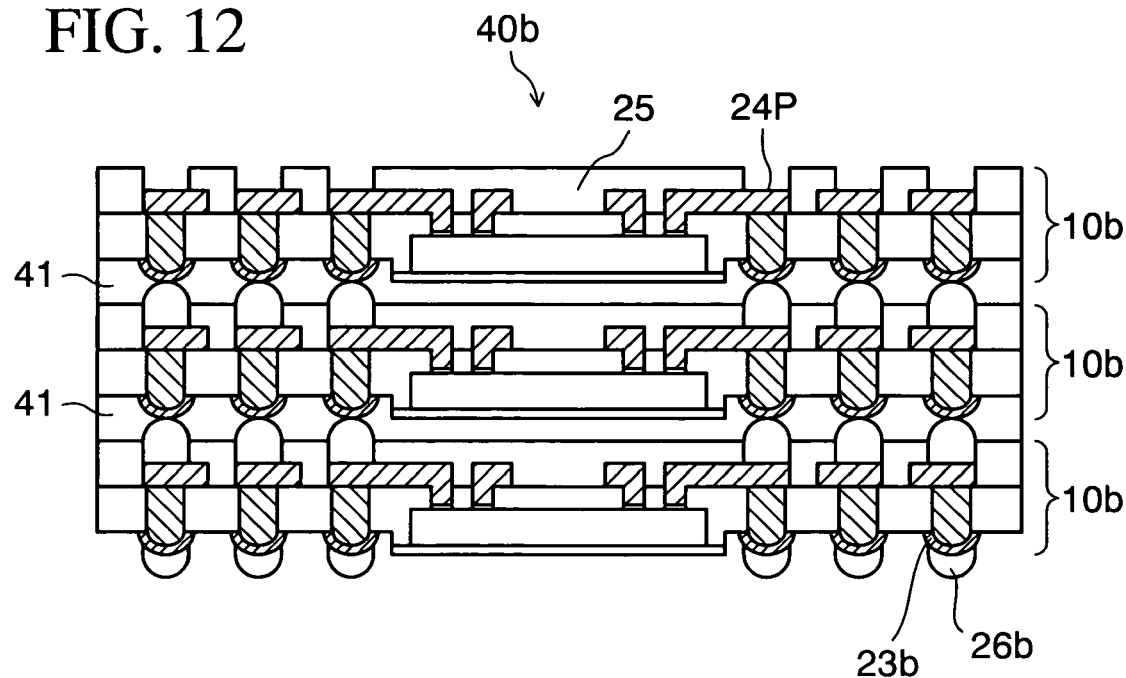
FIG. 12 is a cross-sectional view showing the structure of a semiconductor device according to a sixth embodiment of the present invention.

FIGS. 10 to 12 schematically show cross-sectional structures of semiconductor devices according to fourth to sixth embodiments, respectively.

The semiconductor devices 40, 40a, and 40b (FIGS. 10, 11, and 12) according to the fourth, fifth, and sixth embodiments each have a stacked structure in which semiconductor devices 10, 10a, or 10b (FIG. 1, 4, or 7) according to the first, second, or third embodiment are stacked in three layers to be modularized, respectively. In each of the semiconductor devices 40, 40a, and 40b, two vertically adjacent semiconductor devices 10, 10a, or 10b are electrically connected to each other via the top-and-bottom connecting pads (pad portions 23 or 23b) of one semiconductor device and the external connection terminals (solder bumps 26) of the other, and bonded together using underfill resin 41 filled in the space between both devices.

Further, in the semiconductor device 40 (FIG. 10) according to the fourth embodiment, the semiconductor device 10 in the uppermost layer has no external connection terminals (solder bumps 26) provided therein, and the semiconductor device 10 in the middle layer has the external connection terminals (solder bumps 26) provided only on one surface (upper surface) thereof, and the semiconductor device 10 in the lowest layer has the external connection terminals (solder bumps 26) provided on both surfaces thereof.

Further, in the semiconductor device 40a (FIG. 11) according to the fifth embodiment, the semiconductor device 10 in the uppermost layer has the external connection terminals (solder bumps 26) provided only on one surface (lower surface) thereof, and each of the semiconductor devices 10a in the middle and the lowest layers has the external connection terminals (solder bumps 26) provided on both surfaces thereof.

Moreover, in the semiconductor device 40b (FIG. 12) according to the sixth embodiment, the semiconductor device 10b in the uppermost layer has no external connection terminals (solder bumps 26) provided therein, and the semiconductor device 10b in the middle layer has the external connection terminals (solder bumps 26) provided only on one surface (upper surface) thereof, and the semiconductor device 10b in the lowest layer has the external connection terminals (solder bumps 26 and 26b) provided on both surfaces thereof. In this case, the amount of solder used for the solder bumps 26b on the lower side of the semiconductor device 10b in the lowest layer is relatively small because the pad portions 23b protrude in convex shapes.

Incidentally, in each of the semiconductor devices 40, 40a, and 40b according to the fourth, fifth, and sixth embodiments, description has been made taking as an example the case where the semiconductor devices 10, 10a, or 10b according to the first, second, or third embodiments are stacked in three layers to be a multilayer structure. However, it is a matter of course that the number of stacked layers is not limited to three. Namely, the number of stacked layers can be appropriately selected according to functions required for a semiconductor device having a modularized stacked structure.

Further, in each of the constitutions according to the fourth to sixth embodiments, the external connection terminals (solder bumps 26 or 26b) for the entire stacked structure (40, 40a, or 40b) are provided in the semiconductor device (10, 10a, or 10b) in the lowest layer. However, in contrast to this, the relevant external connection terminals may be provided in the semiconductor device in the uppermost layer.

What is claimed is:

1. A semiconductor device comprising:
   a wiring board; and
   at least one semiconductor element buried in the wiring board,
   wherein the wiring board includes:
   an insulating base material consisting of a single resin layer, and having a first surface and a second surface opposite to the first surface;
   a conductor filled in a first via hole which is formed in a region around the semiconductor element to pierce the insulating base material in a thickness direction, one end of the conductor being covered with a first pad portion which is made of conductive material and which is at the level of the first surface of the insulating base material;
   a wiring layer having a required pattern shape formed on the second surface of the insulating base material, the wiring connecting another end of the conductor, via a second via hole, to an electrode terminal of the semiconductor element, the second via hole being formed in the insulating base material; and
   a protective film formed to cover the wiring layer and the second surface of the insulating base material, with a second pad portion exposed, the second pad portion being delimited in a portion of the wiring layer which corresponds to another end of the conductor, and wherein the semiconductor element is buried in the insulating base material with a semiconductor surface thereof which has the electrode terminal formed thereon being directed to the second surface of the insulating base material; and a surface thereof opposite to the surface having the electrode terminal formed thereon being covered with an insulating layer exposed at the first surface of the insulating base material.

2. The semiconductor device according to claim 1, wherein an external connection terminal is bonded to at least one of the first and second pad portions.

3. A semiconductor device comprising a plurality of stacked semiconductor devices, each being according to claim 2, wherein two adjacent semiconductor devices are connected via the external connection terminal.

4. The semiconductor device according to claim 1, wherein the surface of the semiconductor element opposite to the surface having the electrode terminals formed thereon is covered the die pad portion which is exposed to the one surface of the insulating base material.

5. The semiconductor device according to claim 1, wherein the lower surface is flat.

6. The semiconductor device according to claim 2, wherein the insulating base material is formed in a state where the surface of the semiconductor element opposite to the surface having the electrode terminals formed thereon protrudes from the one surface of the insulating base material.

7. The semiconductor device according to claim 1, wherein the one end of the conductor filled in the via hole protrudes from the one surface of the insulating base material, and the first pad portion is formed to follow a shape of a protruded surface of the conductor.

* * * * *